United States Patent
Blaauw et al.

(10) Patent No.: US 10,447,318 B2
(45) Date of Patent: Oct. 15, 2019

(54) LOW POWER HIGH GAIN RADIO FREQUENCY AMPLIFIER FOR SENSOR APPARATUS

(71) Applicant: The Regents of The University of Michigan, Ann Arbor, MI (US)

(72) Inventors: David T. Blaauw, Ann Arbor, MI (US); David D. Wentzloff, Ann Arbor, MI (US); Li-Xuan Chuo, Ann Arbor, MI (US); Hun-Seok Kim, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 72 days.

(21) Appl. No.: 15/887,212

(22) Filed: Feb. 2, 2018

(65) Prior Publication Data
US 2018/0227002 A1 Aug. 9, 2018

Related U.S. Application Data

(60) Provisional application No. 62/454,118, filed on Feb. 3, 2017.

(51) Int. Cl.
*H04B 1/04* (2006.01)
*H01Q 7/00* (2006.01)
(Continued)

(52) U.S. Cl.
CPC .............. *H04B 1/04* (2013.01); *H01Q 7/00* (2013.01); *H03B 5/1212* (2013.01);
(Continued)

(58) Field of Classification Search
CPC ... H04B 1/40; H04B 1/04; H01Q 7/00; H01Q 23/00; H03B 5/1212; H03B 5/1228; H03B 2200/0008; H03B 2200/0082; H03F 3/19
See application file for complete search history.

(56) References Cited

U.S. PATENT DOCUMENTS 7,262,661 B2   8/2007   Zou
8,125,399 B2 * 2/2012   McKinzie ............ H01Q 223/00
                                                     343/746

(Continued)

OTHER PUBLICATIONS

R. Ni et al "A 915MHz, 6Mb/s, 80pJ/b BFSK receiver with—76dBm sensitivity for high data rate wireless sensor networks", 2014 Symposium on VLSI Circuits Digest of Technical Papers, IEEE (2014).

(Continued)

*Primary Examiner* — Thanh C Le
(74) *Attorney, Agent, or Firm* — Harness, Dickey & Pierce, P.L.C.

(57) ABSTRACT

A wireless communication device is presented for use with a sensor. The wireless communication device includes: an antenna, a driver circuit and a bias circuit. The driver circuit is electrically coupled to the antenna and includes at least one pair of cross-coupled transistors. The bias circuit is electrically coupled to the driver circuit. In a transmit mode, the bias circuit biases the driver circuit with a first bias current. In response to the first bias current, the driver circuit oscillates the antenna. In a receive mode, the bias circuit biases the driver circuit with a second bias current, such that the first bias current differs from the second bias current. In response to the second bias current, the bias circuit amplifies a signal received by the antenna.

16 Claims, 11 Drawing Sheets

(51) Int. Cl.
*H03B 5/12* (2006.01)
*H04B 1/40* (2015.01)

(52) U.S. Cl.
CPC ............. *H03B 5/1228* (2013.01); *H04B 1/40* (2013.01); *H03B 2200/0008* (2013.01); *H03B 2200/0082* (2013.01)

(56) References Cited

U.S. PATENT DOCUMENTS

| | | | |
|---|---|---|---|
| 8,346,198 | B2 | 1/2013 | Kasha et al. |
| 9,455,758 | B1 | 9/2016 | Roberts et al. |
| 2015/0333711 | A1* | 11/2015 | Langer ................. H04B 1/0458 455/127.2 |
| 2016/0277044 | A1* | 9/2016 | Song ........................ H04B 1/04 |
| 2018/0262163 | A1* | 9/2018 | Tokuda .................... H03F 3/19 |

OTHER PUBLICATIONS

H. Ito et al "An ultra-low-power RF transceiver with a 1.5-pJ/bit maximally-digital impulse-transmitter and an 89.5-μW super-regenerative RSSI", Solid-State Circuits Conference, IEEE Asian (2014).

J. Bohorquez et al "A 350 W CMOS MSK transmitter and 400 W OOK super-regenerative receiver for medical implant communications", IEEE Journal of Solid-State Circuits 44.4, pp. 1248-1269 (2009).

\* cited by examiner

Colpitts Oscillator
(single-ended)

LOW POWER HIGH GAIN RADIO FREQUENCY AMPLIFIER FOR SENSOR APPARATUS

GOVERNMENT CLAUSE

This invention was made with government support under grant number CNS1111541 awarded by the U.S. National Science Foundation. The government has certain rights in the invention.

This application claims the benefit of U.S. Provisional Application No. 62/454,118, filed on Feb. 3, 2017. The entire disclosure of the above application is incorporated herein by reference.

FIELD

The present disclosure relates to transceivers for millimeter-scale sensor devices.

BACKGROUND

A wireless sensor network is an example of network in which one or more sensor devices communicate with each other and/or a gateway. As an example, a micro- or millimeter-scale sensor device may be arranged in different locations in a room to detect an environmental condition, such as temperature, light. The sensor devices may transmit a data signal indicative of the condition to a gateway (e.g., a computer) by way of a wireless communication interface disposed within the sensor device.

With technological advancements, the size of the sensor device, which can include a battery, has reduced in recent years. As a result, technical challenges posed by mm-scale devices can include conservation of power while enabling long range non-line of sight wireless communication. To increase the communication range of the sensor device, the communication device can utilize power amplifiers and/or low noise amplifiers, for transmitting or receiving signals. However, such electronic components can consume a significant amount of power, and therefore, require a larger battery.

This section provides background information related to the present disclosure which is not necessarily prior art.

SUMMARY

This section provides a general summary of the disclosure, and is not a comprehensive disclosure of its full scope or all of its features.

A wireless communication device is presented for use with a sensor. The wireless communication device includes: an antenna, a driver circuit and a bias circuit. The driver circuit is electrically coupled to the antenna and includes at least one pair of cross-coupled transistors. The bias circuit is electrically coupled to the driver circuit. In a transmit mode, the bias circuit biases the driver circuit with a first bias current. In response to the first bias current, the driver circuit oscillates the antenna. In a receive mode, the bias circuit biases the driver circuit with a second bias current, such that the first bias current differs from the second bias current. In response to the second bias current, the bias circuit amplifies a signal received by the antenna. More specifically, the second bias current has a magnitude set to substantially cancel resistive loss of the antenna and the first bias current has a magnitude larger than the second bias current.

In one embodiment, the driver circuit may be further defined as a pair of NMOS field effect transistors cross-coupled to each other and coupled in parallel with the antenna. Alternatively, the driver circuit is defined as a first pair of NMOS field effect transistors cross-coupled to each other and coupled in parallel with the antenna, and a second pair of PMOS field effect transistors cross-coupled to each other and coupled in parallel with the antenna, wherein the bias circuit biases the first pair of NMOS field effect transistors. The driver circuit may also be defined as a Colpitts oscillator.

The wireless communication device may further include a frequency tuning circuit electrically coupled in parallel with the antenna, such that the tuning circuit includes at least one capacitor electrically coupled in parallel with the antenna.

In some embodiments, the wireless communication device is integrated into a sensor device, where the sensor device includes the antenna sandwiched between two circuit boards, the driver circuit is mounted to one of the two circuit boards and the bias circuit is mounted to one of the two circuit boards.

Further areas of applicability will become apparent from the description provided herein. The description and specific examples in this summary are intended for purposes of illustration only, and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Millimeter-scale sensor devices include a wireless communication device for exchanging data with other devices, such as other sensor devices and/or gateway devices. Conventionally, such sensor devices can be limited in non-line of sight long range wireless communication due to, for example, antenna efficiency and/or power limitation of the batteries provided in the device.

Figure 1:
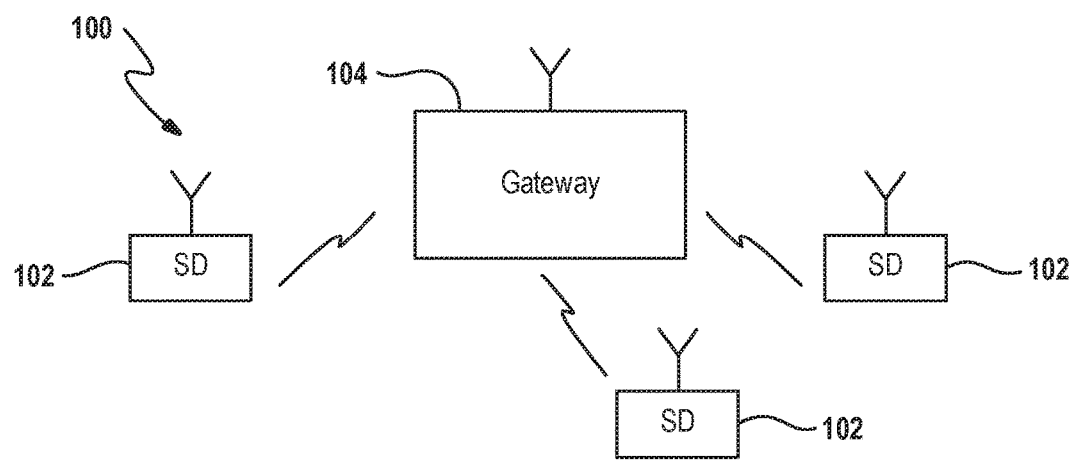
FIG. 1 is a diagrammatic view illustrating a wireless sensor network having multiple sensor devices in communication with a gateway.

FIG. 1 illustrates an example wireless network 100 in which mm-scale sensor devices or sensor apparatuses 102 communicate with a gateway 104. The wireless network 100 may be, for example, an internet-of-things wireless network, an autonomous vehicular network, and/or other suitable networks in which small-scale drivers (i.e., nodes) exchange data with another device and/or a central system (e.g., a gateway).

Figure 2:
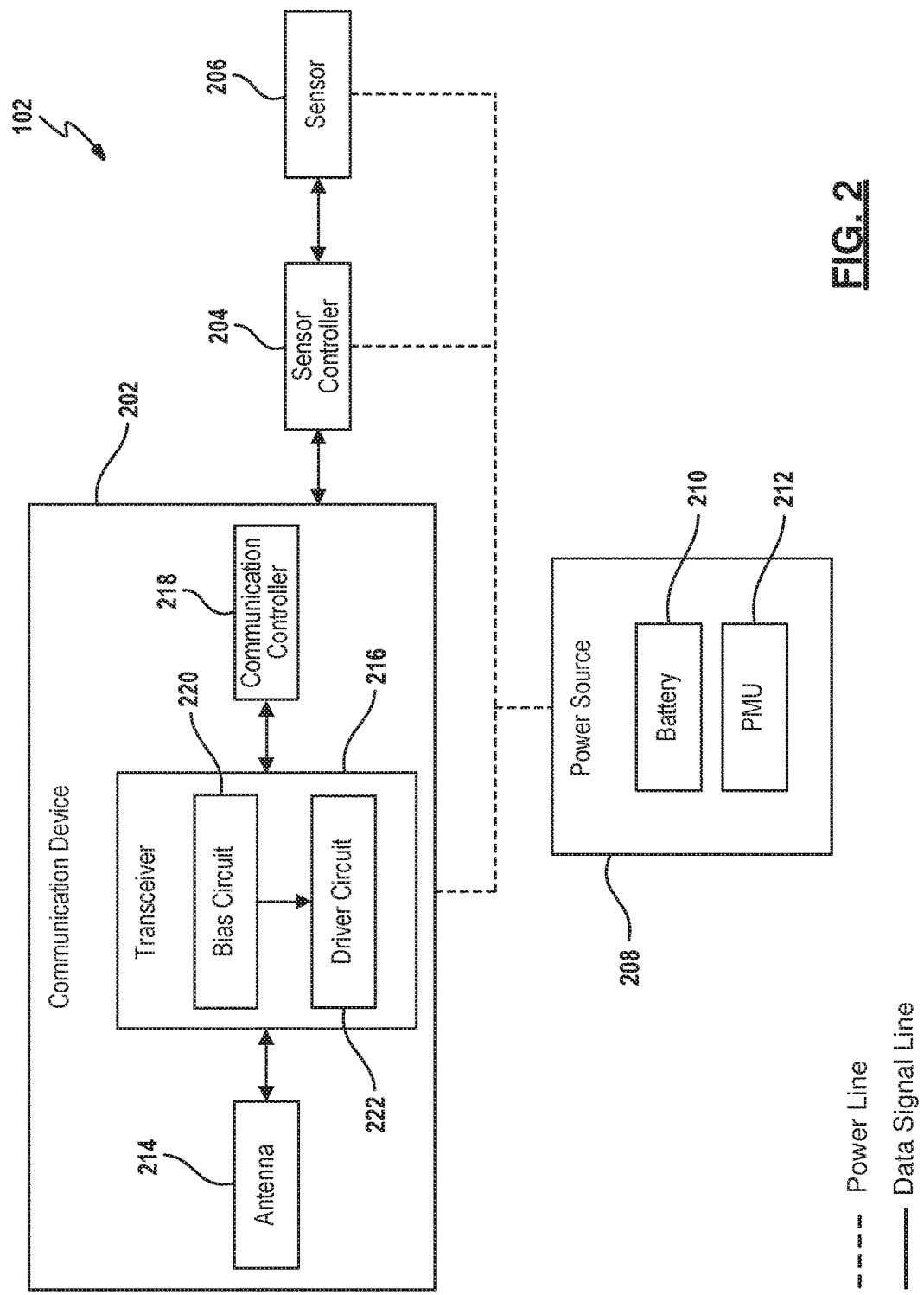
FIG. 2 illustrates a block diagram of a sensor device.

The sensor devices 102 may also be referred to as sensor nodes and may detect dynamic properties of the environment in which the sensor device is positioned. With reference to FIG. 2, a given sensor device 102 may include a communication device 202, a sensor controller 204, a sensor 206, and a power source 208. The communication device 202 of the present disclosure increases the long distance communication range of the sensor device 102, as described in detail below.

In an example embodiment, the sensor controller 204, in conjunction with the sensor 206, may output data regarding a dynamic property detected by the sensor 206. For example, the sensor 206 may include photovoltaic (PV) cells for detecting light and may output a voltage indicative of the amount of light detected. The sensor controller 204, in return, transforms the voltage into a data signal to be transmitted to the gateway 104 by way of the communication device 202. Alternatively, the sensor 206 may be configured to detect other dynamic properties, such as pressure, temperature, etc. The sensor controller 204 may also receive information from the gateway 104, such as a communication request, by way of the communication device 202. The sensor controller may include, for example, a processor and a computer-readable medium that stores instructions executed by the processor.

The power source 208 supplies electric power to the components of the sensor device 102. In an example embodiment, the power source 208 may include a battery 210 and a power management unit (PMU) 212. The battery 210 may be a thin film battery of, for example, four volts. The PMU 212 may distribute power to other components in the sensor device 102.

The communication device 202 establishes wireless communication, such as RF communication, with external devices within a communication range of the sensor device. In the example embodiment, the communication device 202 includes an antenna 214, a transceiver 216, and a communication controller 218.

In an example embodiment, the antenna 214 is a magnetic dipole antenna that may be coupled to a resonant circuit to improve the efficiency of the antenna 214. Alternatively, the antenna can be an electric dipole antenna, but such an antenna may require a larger resonator circuit to address the high impedance of the antenna, thereby increasing the size of the communication device 202 and, as a result, the sensor device 102.

The antenna 214 is operable as a receive (i.e., a receive mode) and a transmitter (i.e., a transmit mode) by way of the communication controller 218. The communication controller 218 is communicably coupled to the sensor controller 204 and controls the various electrical components of the communication device 202 to transmit and receive data. For example, when the sensor controller 204 outputs a data signal, the communication controller 218 may operate the antenna 214 in the transmit mode by way of the transceiver 216 and, when a data signal is not being transmitted, the communication controller 218 may operate the antenna 214 in the receive mode to receive signals from other devices.

In an example embodiment, the transceiver 216 includes a bias circuit 220 and a driver circuit 222. The bias circuit 220 is electrically coupled to the driver circuit 222 and is operable by the communication controller 218 to output a bias current to the driver circuit 222. More particularly, the bias circuit operates, in a transmit mode, to bias the driver circuit with a first bias current, and operates, in a receive mode, to bias the driver circuit with a second bias current, such that the first bias current differs from the second bias current. In response to the first bias current, the driver circuit oscillates the antenna. In response to the second bias current, the driver circuit amplifies a signal received by the antenna as further described below.

Figure 3:
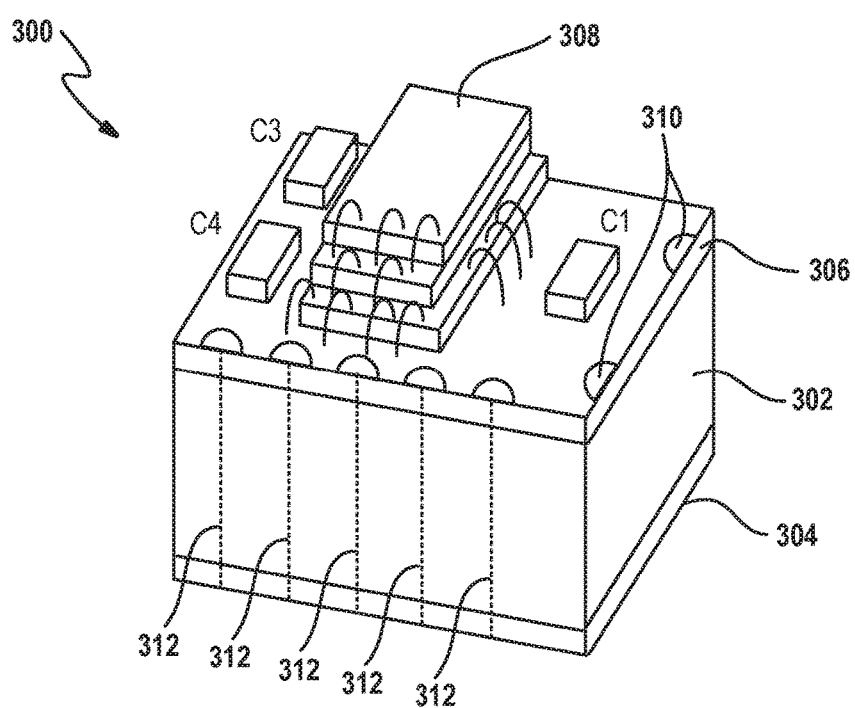
FIG. 3 illustrates an example structural architecture of the sensor device.

FIG. 3 illustrates an example of a sensor device 300 that is, for example, 3×3×3 mm³. The sensor device 300 is an example of the sensor device 102. In an example embodiment, the sensor device 300 includes a three-dimensional magnetic antenna 302 disposed between a first circuit board 304 and a second circuit board 306. An electronic chip stack 308 and various electronic components (e.g., capacitors C1, C3, and C4 in FIG. 4) are disposed on a surface of the second circuit board 306 that is opposite to the antenna 302. The electronic chip stack 308 is configured to include the communication device and the sensor controller, described herein. The antenna 302 is electrically coupled to the chip stack 308 by way of terminals 310. The sensor and the battery of the power source (not shown) are disposed on a surface of the first circuit board 304 opposite the antenna 302. Multiple through-connections 312 (i.e., vias) are provided to electrically couple the electronic components on the second circuit board, such as the chip stack 308, with the electronic components on the first circuit board, such as the sensor and battery.

By utilizing the magnetic dipole antenna 302, the electronics of the sensor device 300 may be stacked on top and/or bottom of the antenna 302, thus enabling compact integration of the components. Conversely, an electric dipole antenna typically requires physical separation from the electronic components, and may therefore increase the size of the sensor device 300. While a specific structural architecture of the sensor device is described and illustrated, it should be appreciated that the components of the sensor device may be arranged in various suitable ways, and should not be limited to the arrangement illustrated in the figures.

Figure 4:
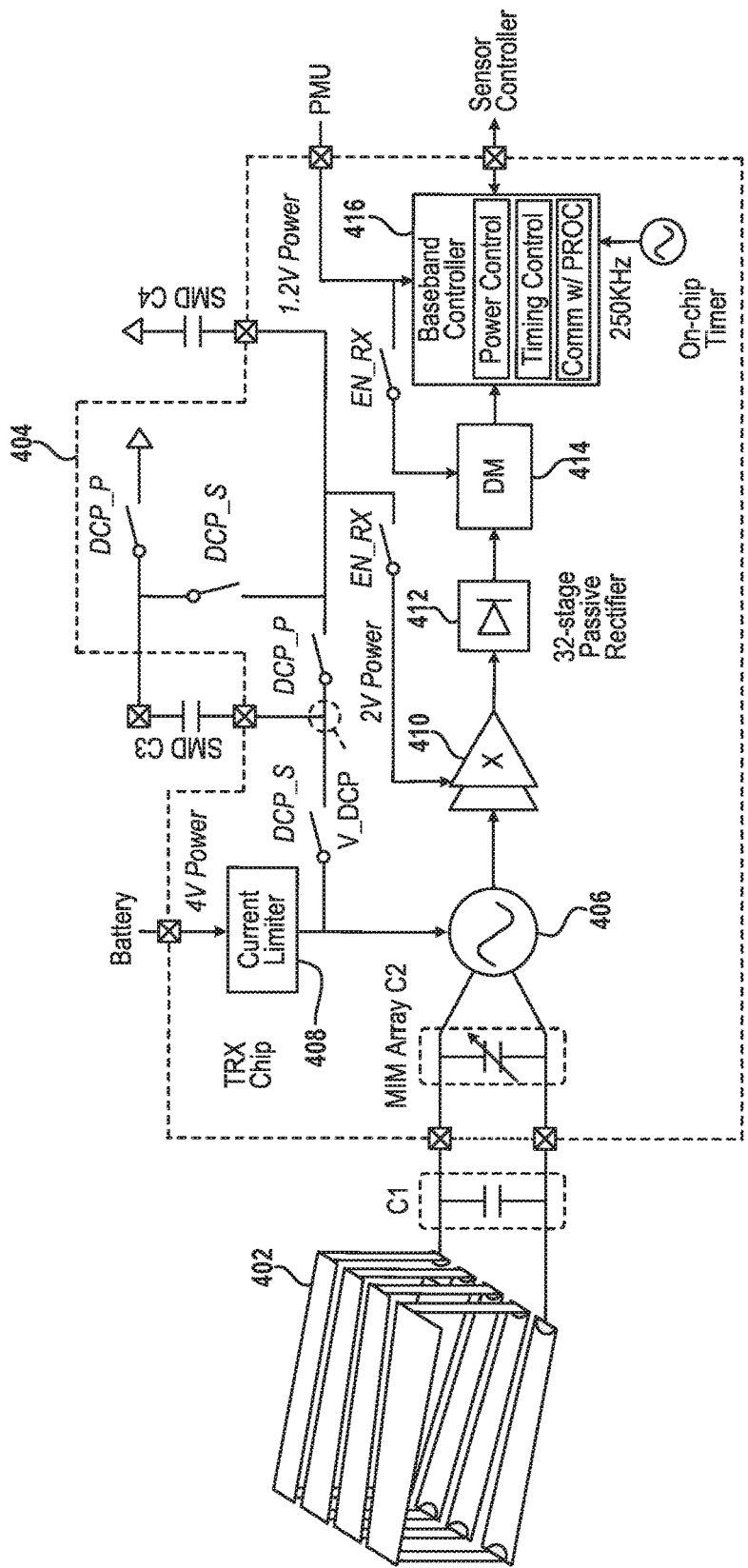
FIG. 4 is a block diagram of a communication device of the sensor device.

FIG. 4 illustrates an example embodiment of the communication device 202. In the example embodiment, the antenna 402 is a 3D magnetic dipole antenna having a 4-loop configuration constructed from two copper layers. The antenna 402 is connected to a transceiver 404 by way of a capacitor C1, which is a surface-mount device and may have a capacitance of, for example, 0.5 pF. Other types of inductive antennas are also contemplated by this disclosure.

The transceiver 404 is an example of the transceiver 216 and, in the example embodiment, the transceiver 404 includes a variable capacitor C2, a driver-bias circuit 406, a current limiter 408, an amplifier 410, a rectifier 412, a demodulator (DM) 414, and a baseband controller 416. The amplifier 410, the rectifier 412, and the demodulator 414 may be part of a receiver circuit for processing an incoming signal received by the antenna 402 in the receive mode. For the purpose of brevity, specific electronic components that are part of a transmitter circuit for processing a signal to be transmitted by the antenna 402 are not illustrated. Thus, while specific electronic components are illustrated, it should be appreciated that the transceiver 404 may include other electronic components.

The variable capacitor C2 may be an integrated digitally-switched capacitor array (e.g., a metal-insulator-metal (MIM) capacitor array) and forms a resonant tank with the antenna and capacitor C1. In an example embodiment, the resonant tank has a quality-factor (Q) of 110 at 915 MHz. A resonant frequency of the antenna 402 is tuned using the variable capacitor $C_2$ within, for example, a range of 891.4-932 MHz.

The driver-bias circuit 406 is electrically coupled to the current limiter 408 and includes the driver circuit and the bias circuit, as described below. Based on a control signal from the baseband controller 416, the driver-bias circuit 406 operates the antenna in the receive mode to receive a signal or in the transmit mode to transmit a signal.

Figure 13:
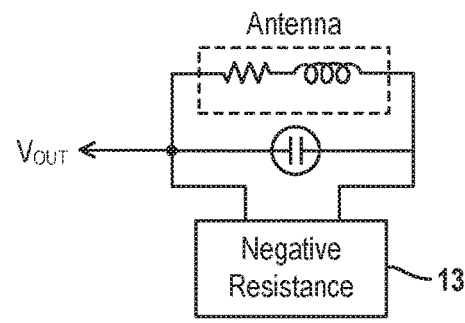
FIG. 13 is a generic implementation for the driver-bias circuit.
Figure 14A:
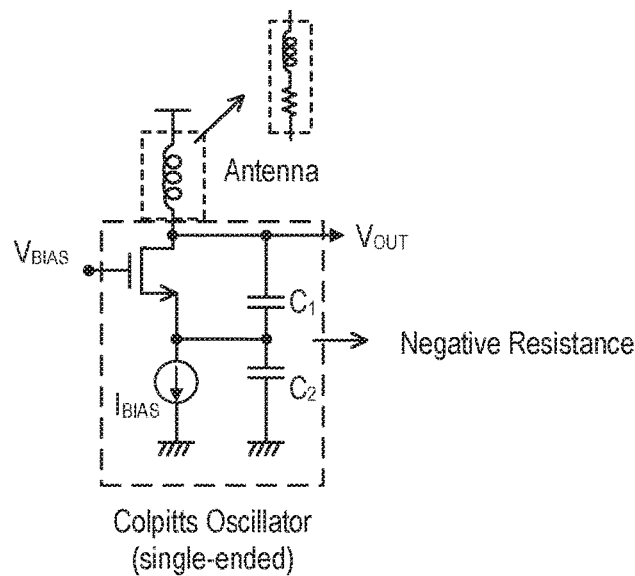
FIGS. 14A and 14B are schematics for alternative embodiments of driver circuits suitable for use in the communication device.
Figure 14B:
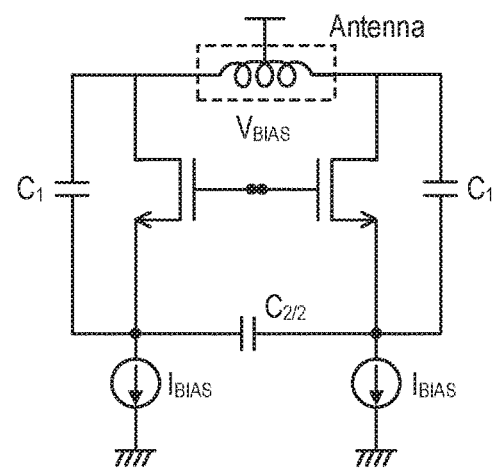

With reference to FIG. 13, the driver-bias circuit 406 may be viewed generically as a negative resistance circuit 13. One example embodiment of a negative resistance circuit is a pair of cross-coupled transistors. The pair of cross-coupled transistors may be configured to oscillate the antenna or amplify the signal received by the antenna as described below. In another example embodiment, the negative resistance circuit can be implemented by a single-ended Colpitts oscillator as shown in FIG. 14A or can be implemented by a differential Colpitts oscillator as shown in FIG. 14B. Other implementations for driver-bias circuit 406 are also contemplated by this disclosure.

Figure 5:
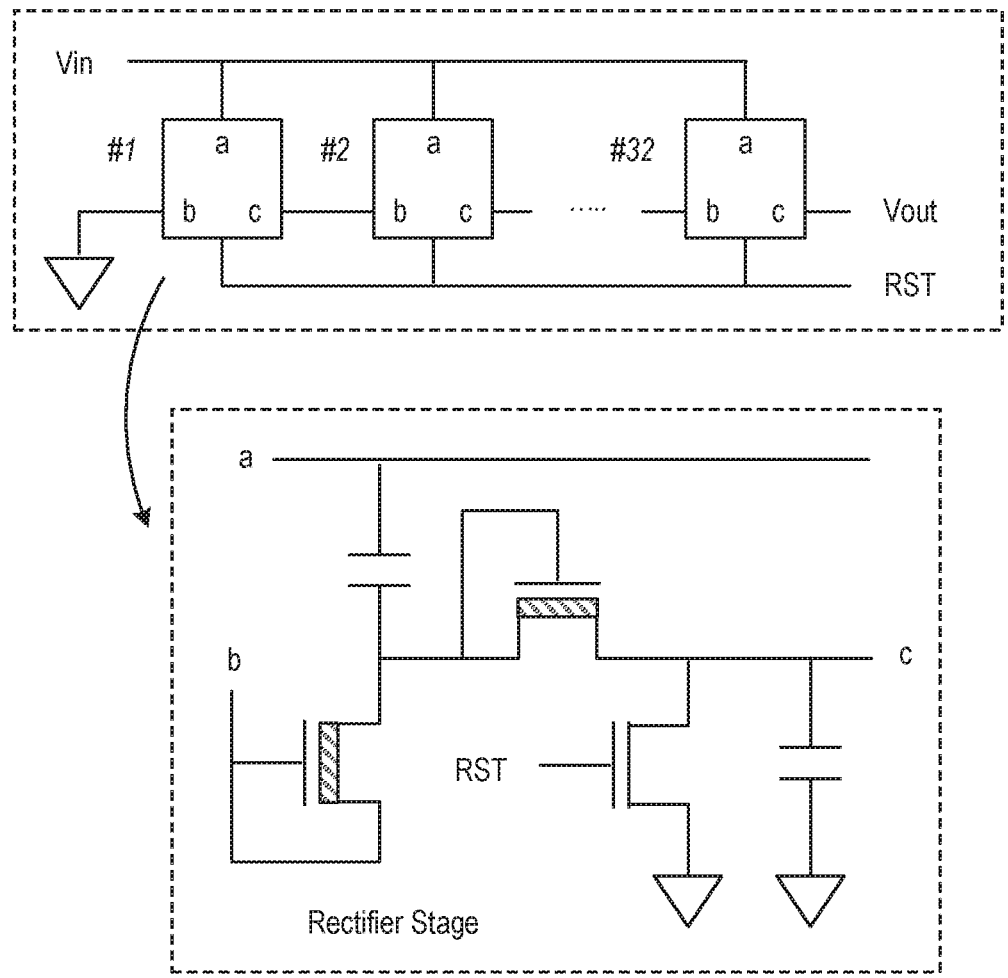
FIG. 5 is an example of a rectifier for the communication device of FIG. 4.
Figure 6:
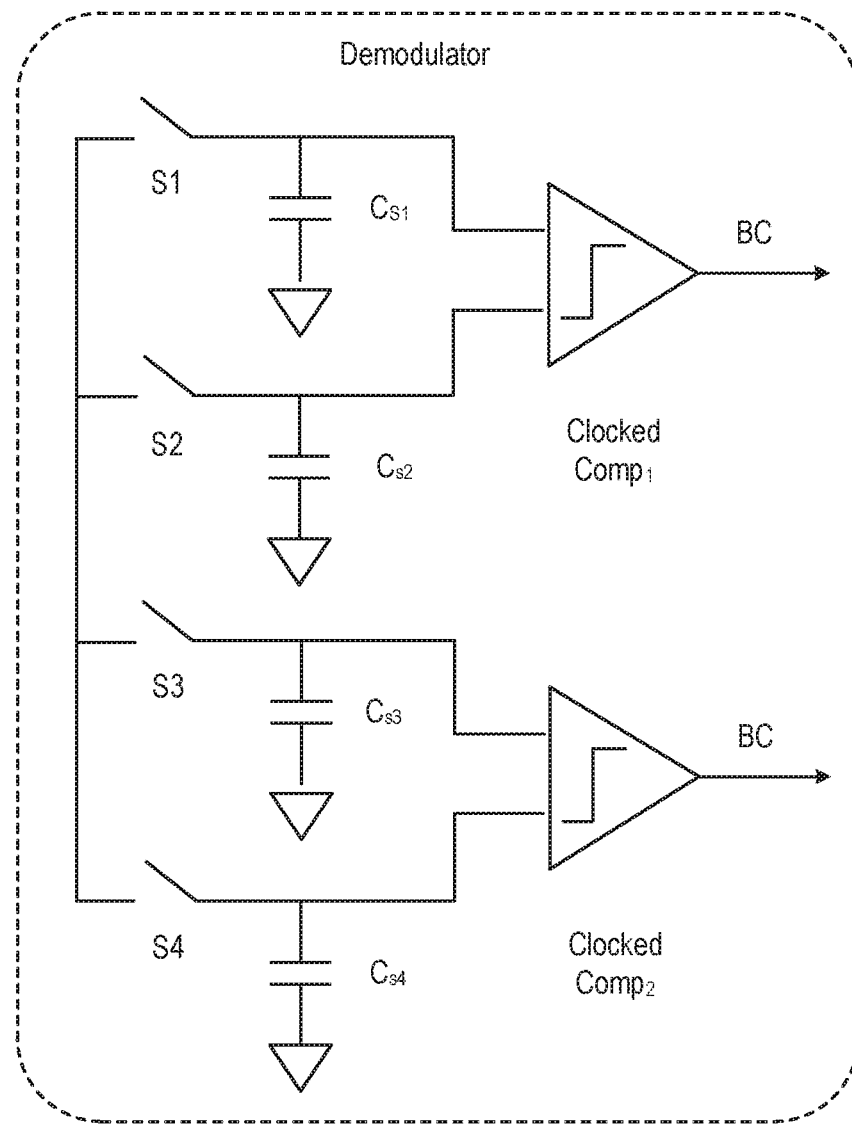
FIG. 6 is an example of a demodulator for the communication device of FIG. 4.

In an example embodiment, the amplifier 410 may be a two-stage amplifier that amplifies the RF signal received by the antenna 402. For example, the amplifier 410 may amplify the signal by 17 dB. The rectifier 412 may be a 32-stage passive rectifier that converts the incoming AC signal to DC signal. FIG. 5 illustrates an example implementation for the rectifier 412. The demodulator 414 demodulates the DC signal from the rectifier 412 and may include 4 sample-hold (S/H) capacitors and 2 clocked comparators. An example implementation of the demodulator 414 is illustrated in FIG. 6. In operation, the output from the rectifier 412 is sequentially sampled by S/H capacitors. Once two capacitors (e.g., $C_{s1}$ & $C_{s2}$ or $C_{s3}$ & $C_{s4}$) store the voltage for the $1^{st}$- and $2^{nd}$-half periods of an incoming binary PPM symbol, an associated comparator ($Comp_1$ or $Comp_2$) generates a demodulated bit. Accordingly, an accurate reference voltage for the comparator may not be needed.

The baseband controller 416 is an example of the communication controller 218 and may include a processor that executes pre-stored firmware. The baseband controller 416 controls operation of electronic components of the transceiver 404, such as the driver-bias circuit 406, to transmit a signal via, for example, ON-OFF keying or receiving a signal.

Figure 7:
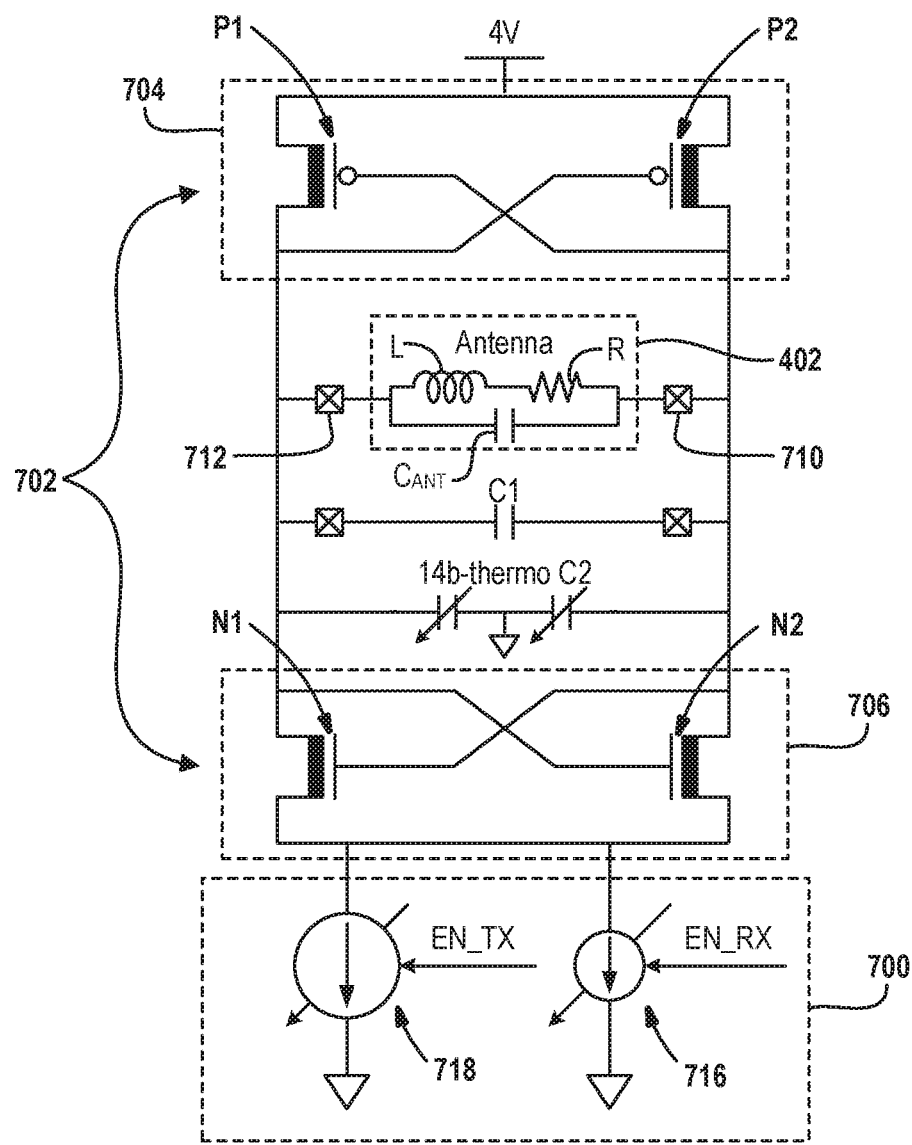
FIG. 7 is an example of a driver circuit and a bias circuit for the communication device of FIG. 4.

FIG. 7 illustrates an example of the driver-bias circuit 406. The driver-bias circuit 406 includes a bias circuit 700 and a driver circuit 702. The bias circuit 700 is an example of the bias circuit 220, and the driver circuit 702 is an example of the driver circuit 222. In addition, in FIG. 5, the antenna 402 is represented by inductor L, capacitor $C_{ANT}$, and resistor R. The resistor R represents a loss of the antenna 402. The inductor L and the capacitors C1 and C2 form an LC resonant tank. In the receive mode, the resonant tank may increase the quality-factor (Q) of the antenna 402 and, therefore, further amplify the signal received by the antenna 402.

In the example embodiment, the driver circuit 702 include two pair of cross-coupled transistors. That is, the driver circuit 702 includes a first pair of cross-coupled transistors 704 and a second pair of cross-coupled transistors 706. The first pair of cross-coupled transistors 704 is comprised of p-channel transistors P1 and P2; whereas, the second pair of cross-coupled transistors 706 is comprised of n-channel transistors N1 and N2. The transistors P1, P2, N1, and N2 may be field effect transistors, such as MOSFETs. While the example embodiment is shown with two pair of cross-coupled transistors, it is readily understood that the circuit may be implemented with only one pair of cross-coupled transistors arranged either on the high side or low side of the antenna.

Transistors P1, P2, N1, and N2 are connected to form two inverting amplifiers around the antenna 402. For example, the gate terminals of transistors P1 and N1 (i.e., control terminals) are electrically coupled to each other to form the input terminal of a first inverting amplifier, and the drain terminals of the transistors P1 and N1 are electrically coupled to each other to form the output terminal of the first inverting amplifier. The input terminal of the first inverting terminal is coupled to a first terminal 710 of the antenna 402 and the output terminal of the first inverting terminal is coupled to a second terminal 712 of the antenna 402. Transistors P2 and N2 are connected in a similar manner to form a second inverting amplifier, where the input terminal of the second inverting amplifier (i.e., gate terminals of transistors P2 and N2) is connected to the second terminal 712 of the antenna 402 and the output terminal of the second inverting amplifier (i.e., drain terminals of transistor P2 and N2) is connected to the first terminal 710 of the antenna 402.

The communication controller 218 (e.g., baseband controller 416) operates the antenna 402 in the receive mode or in the transmit mode by controlling the bias circuit 700 and, more particularly, the bias current applied to the driver circuit 702. In an example embodiment, the bias circuit 700 includes a first current source 718 to generate the first bias current and a second current source 716 to generate the second bias current less than the first bias current. For example, the second current source 716 may output a bias current that is less than or equal to 20 μA and the first current source 718 may output a bias current that is greater than or equal to 100 μA.

The specific current value and/or range for values of the first bias current and the second bias current may be determined based on the performance characteristics of the antenna 402. More particularly, the first bias current is selected so that the antenna oscillates when the driver circuit 702 receives the first bias current. On the other hand, the second bias current is selected so that the antenna is dampened to reduce noise when the driver circuit 702 receives the bias current. In particular, second bias current has a magnitude set to substantially cancel resistive loss of the antenna and thereby increase quality factor during the receive mode. In one example, the second bias current is set proportional to square root of the resistive loss. Accordingly, the performance characteristic of the antenna 402 may be used to select the appropriate bias current for the transmit mode and the receive mode.

Figure 8:
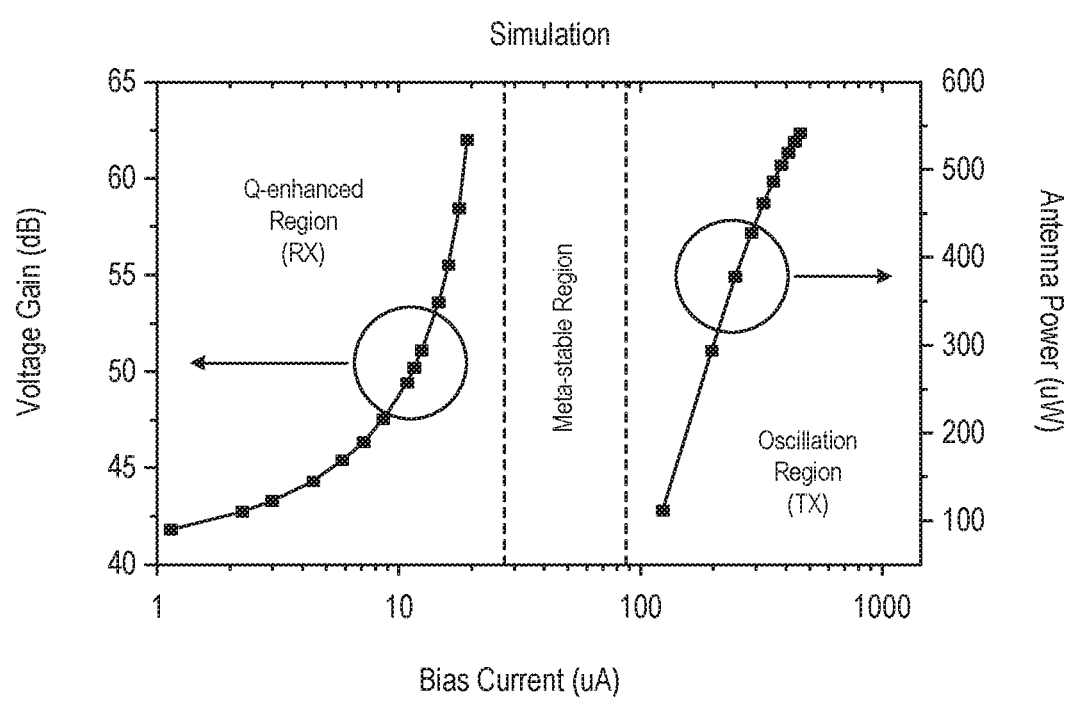
FIG. 8 is a graph that illustrates a performance characteristic of an antenna with respect to a bias current.

By way of example, FIG. 8 is a graph depicting the voltage gain and antenna power vs. bias current. To operate the antenna in the receive mode, the bias current should be within the Q-enhanced region, and to operate the antenna in the transmit mode, the bias current should be within the oscillation region. In selecting the optimal bias current for the receive mode, the bias current should be high enough to achieve optimal voltage gain in order to substantially counter the resistive loss of the antenna but low enough to prevent oscillation of the antenna.

One method for selecting the bias current may include tuning the antenna to the meta-stable region by gradually increasing the bias current until the antenna begins to oscillate, and then reducing the bias current by a predetermined amount until the antenna is no longer oscillating. For example, the bias current can be gradually increased, and when the demodulator outputs all '1', it is determined that the antenna is oscillating and the bias current can be reduced by, for example, 10 µA. Basically, once the antenna begins to oscillate (e.g., the meta-stable or oscillation region), the bias current may be reduced in predetermined increments (e.g., 5 µA, 10 µA, etc) until the antenna is no longer oscillating (e.g., in the Q-enhanced region). The tuned bias current can be pre-stored as the second bias current for the receive mode. In selecting the first bias current, the bias current may be tuned to the oscillation region and a current range in which the antenna power is optimal may be selected as the first bias current. It should be understood that other suitable methods may be used for selecting the bias current for the receive mode and/or the transmit mode.

In operation, the communication device 202 of the present disclosure utilizes the same driver circuit 222 for operating the antenna 214 in the receive mode and the transmit mode. To receive signals, the communication controller 218 operates the driver circuit 222 as an amplifier by having the bias circuit 220 output the second bias current to the driver circuit 222. As discussed above, the cross-coupled transistors of the driver circuit 222 form two inverting amplifiers around the antenna 214 and substantially reduce the resistive loss associated with the antenna 214. By reducing the resistive loss, the driver circuit 222 increases the quality-factor of the antenna 214 and thus, increases the sensitivity and communication range of the antenna 214.

In the receive mode, the cross-coupled pairs are biased in a non-oscillating region (e.g., bias current <20 µA) as opposed to the oscillation region (bias current >100 µA). This increases the quality factor of the resonant tank (e.g., from 110 to 300), which results in a voltage gain (e.g., 49 dB voltage gain at 43 µW). As an amplifier, the driver circuit replaces the high power low noise amplifier (LNA) and bulky off-chip channel select filter to prevent the re-radiation of a super-regenerative receiver. The bias current of the cross-coupled pair can be digitally tuned with a tail transistor.

As it relates to the example embodiment in FIG. 7, the amplifier is followed by a 2-stage amplifier and a 32-stage rectifier serves as an envelope detector (ED). The demodulation of the 2-PPM signal sent from gateway is to compare the energy at each pulse position. One can avoid setting a threshold voltage for comparators and have better interference tolerance. Different from the parallel resonant in the transmit mode, the antenna and the tuning capacitor forms a series resonant circuit, so the received voltage will be amplified by Q-times. The bias current is set with enough back-off margin to ensure its stability. The boosted-Q gives us extra 20 dB gain at RF with very low power consumption. In addition, because of the high-Q tank, one can have a highly selective front-end filter response, which increases the receiver blocker tolerance and eliminates the need of an off-chip channel selection filter. Another advantage of Q-enhanced amplifier is that it does not have the oscillation period that is typical in the super-regenerative receiver. As a result, there is no re-radiation issue with the proposed amplifier. So one can safely co-design the amplifier with antenna and don't need an isolation amplifier which is typically used in the super-regenerative receiver.

When the communication controller 218 is instructed to transmit a signal (e.g. data signal) by the sensor controller 204, the communication controller 218 operates the driver circuit 222 as an oscillator by having the bias circuit 220 output the first bias current to the driver circuit 222. In response to the first bias current, the cross-coupled transistors operate to oscillate the antenna 214 to transmit a signal at the resonant frequency of the antenna 214.

In the transmit mode, in lieu of a power amplifier (PA) and a phase locked loop (PLL), the communication device 202 utilizes the driver circuit 222 to resonate the antenna 214 at, for example, 915 MHz with a quality factor (Q) of 110. While the open-loop operation may result in carrier frequency drift, the gateway can be reconfigured to have a wider frequency search. Thus, the communication device of the present disclosure may reduce the overall power consumption of the communication device and increase the communication range of the sensor device.

The peak transmitter current may exceed the battery current limit, and therefore the transceiver, in the transmit mode, may operate from a 0.5 µF storage cap when $C_3$ and $C_4$ (FIG. 4) are series-connected while the battery, under the protection of the current limiter, continually charges the storage cap. The relatively long storage cap recharge time between transmit pulses results in inherent sparsity that can be utilized to realize a new energy-efficient modulation scheme that conveys multi-rate trellis-coded bits in the form of sparse M-ary PPM. In the transmit mode, the baseband controller supports dynamically adjustable modulation parameters such as the pulse width, number of pulse repetition, trellis-code rate (¼, ⅓, ½, 1, 2, 3, 4) for error correction, and PPM modulation size M.

As it relates to the example embodiment in FIG. 7, the baseband controller will directly modulate the EN_TX signal to transmit the M-PPM signal. The transmitter is a power oscillator with antenna as the resonant component with 4V supply to maximize the output power. It transmits the signal through parallel amplification of the current flows through the antenna coil. The advantage of this structure is that we don't need an additional carrier frequency generation (local oscillator) circuitry, which saves a lot of power. The intrinsically high-Q antenna lowers the power consumption of oscillation and the measured efficiency is 32%. In order to maximize the Q of oscillation tank, one can use a high-Q off-chip SMD capacitor as the coarse frequency tuning component. In this embodiment, a two on-chip capacitor banks is sued for fine-range frequency tuning. One major disadvantage of this free-running oscillator approach is the carrier frequency drift although the carrier frequency drift can be tracked by the powerful signal processing on the gateway.

Since the gateway can be much more powerful and larger than the sensor node, it has less constraint on power budget. The gateway can even be powered directly from the electrical outlet. The proposed network topology is a star network, every sensor node will link to a nearby gateway. The gateway will collect data from sensor nodes and upload to a cloud server via WiFi. In this communication network scheme, the gateway has excellent receiver sensitivity, strong transmitter power and digital signal processing ability. Therefore, in the idle state, the sensor node is sleeping in order to save energy, while the gateway receiver is always listening to find a nearby sensor node. Further details regarding a similar communication protocol may be found in the article "A 10 mm$^3$ inductive coupling radio for syringe-implantable smart sensor nodes", IEEE Journal of Solid-State Circuits, Vol. 51, NO. 11 (November 2016) which is incorporated in its entirety by reference.

Figure 9:
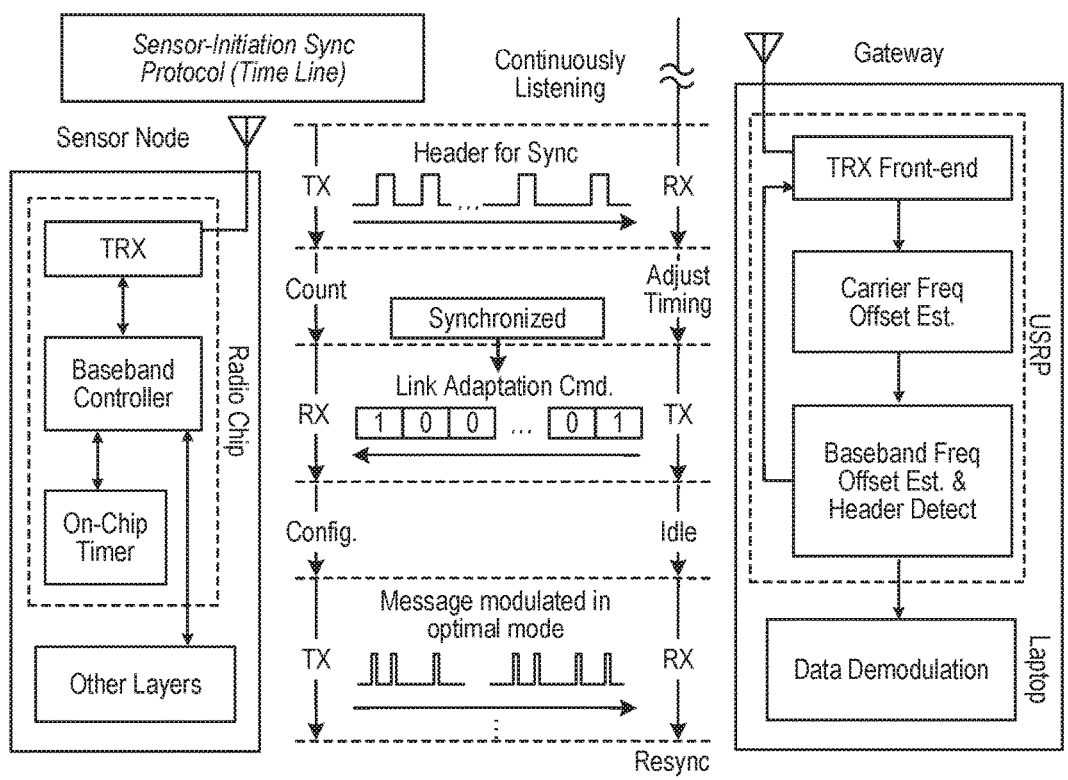
FIG. 9 is a diagrammatic view illustrating an example sensor initiation protocol.

FIG. 9 shows a timing diagram for the protocol. The synchronization is performed on the gateway, so the gateway is adapting to the baseband and carrier frequency offset on the sensor node. In addition, the gateway will analyze the channel and reconfigure the sensor node with optimal settings according to different environment. It is referred to as link adaptation.

Sensor node first initiates the communication by sending headers. Gateway is continuously listening to the channel until it finds a valid header. After the header is received, the gateway starts analyzing and calculating the frequency offset. There is a pre-defined waiting time in sensor node, waiting for gateway synchronization. In this period, gateway estimates and adjusts its baseband timing and carrier frequency. After the waiting time, the gateway is perfectly synchronized to the sensor node and it will send a return packet with link updates commend. For saving the energy, the receiver on the sensor node will only turn on for a pre-defined return packet length and perform a very simple sampling and decoding process. No synchronization process is needed at the sensor node. So in order to send the return packet to sensor node, gateway needs to track the pre-defined waiting time while doing the calibration and sends out the packet on time. Otherwise, it will miss the sensor node receiver turn-on period and the communication will fail.

For multiple node access, the header from each sensor node is generated from different pseudo-noise code (PN code) on the sensor node to support multiple access scheme. The signal coding scheme of the sensor node transmitter is the convolutional coding, which supports multiple coding rate (4, 3, 2, 1, ½, ⅓, ¼) in different environment. The system supports different parameters that are re-configurable on-the-fly, such as pulse width, pulse repetition, and coding rate. As a result, we can do on-the-fly trade-off between data rate and link distance. It is understood that other communication protocols fall within the broader aspects of this disclosure.

Figure 10A:
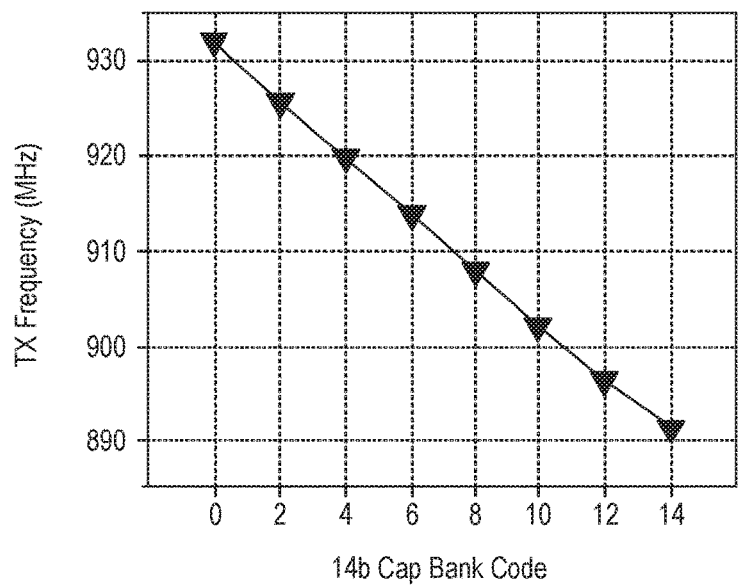
FIGS. 10A and 10B are graphs depicting the tuning range and effective radiated power, respectively, for the transmitter.
Figure 10B:
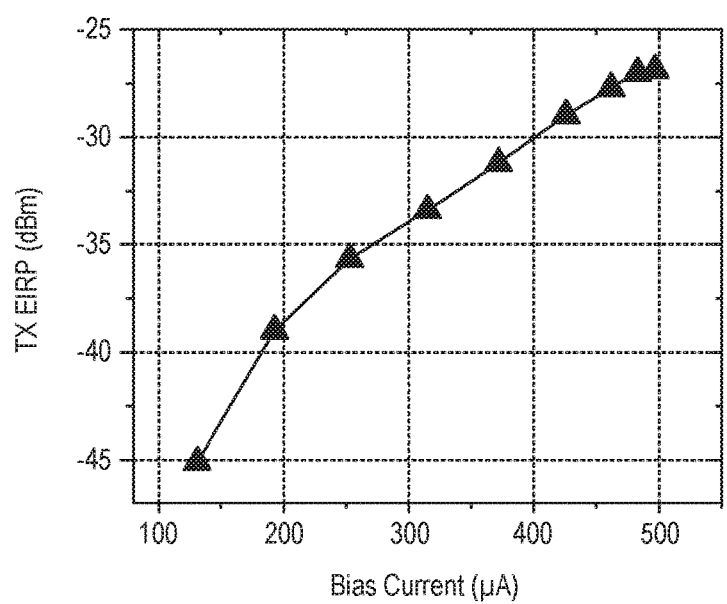

FIG. 10A shows the tuning range of the transmitter in the example embodiment. The x-axis is tuning thermometer code, the y-axis is carrier frequency. An on-chip capacitor bank is used for tuning. It has 14 tuning bits with 40 MHz tuning range. FIG. 10B is the measured EIRP as a function of the transmitter bias current. The maximum EIRP was measured at −27 dBm with 500 uA bias current, including the antenna efficiency. The peak power consumption is 2 mW from 4V.

Figure 11:
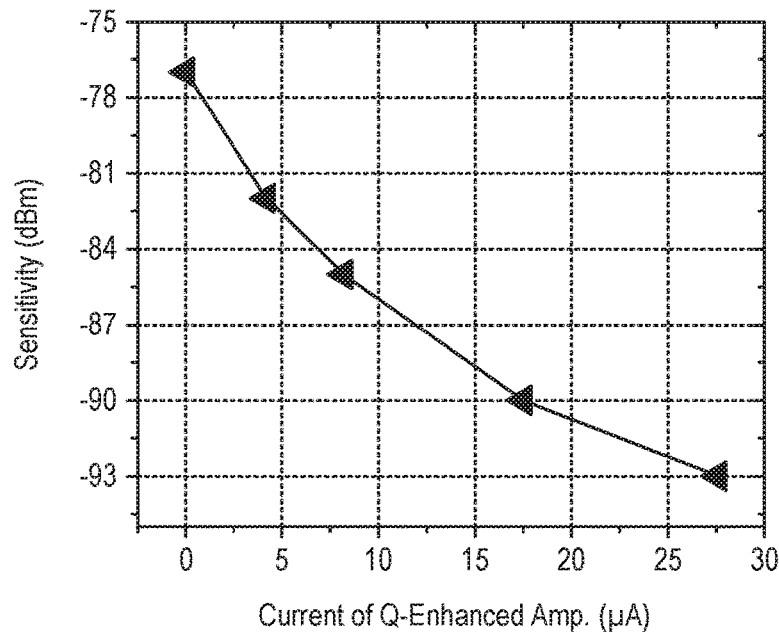
FIG. 11 is a graph depicting sensitivity as a function of bias current.
Figure 12:
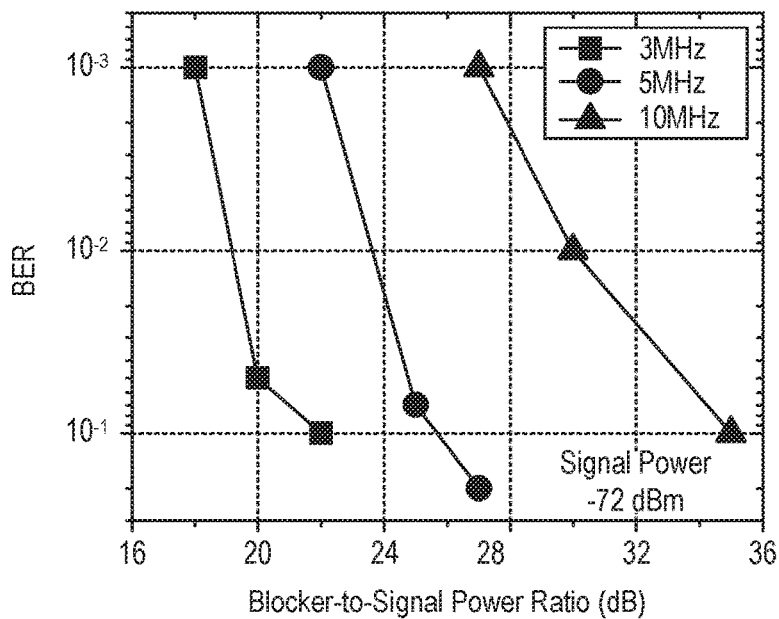
FIG. 12 is a graph depicting blocker tolerance at different offsets.

FIG. 11 is the sensitivity as a function of Q-enhanced amplifier bias current. Because the front-end is co-designed with antenna and not impedance-matched to 50 Ω, it cannot do the wired test. The receiver sensitivity was measured wirelessly after initially transmitting headers to the gateway and performing gateway synchronization. The sensitivity was measured −93 dBm at 30 kbps data rate with 10$^{-3}$ BER. Because of our receiver sampling and demodulation scheme, the single-tone blocker will not affect our system. The measured modulated blocker from 3 MHz to 10 MHz offset is shown in FIG. 12. The system has good blocker tolerance thanks to the Q-enhanced technique. Recall that one needs to perform gateway synchronization before receiving packet. In fact, the blocker tolerance performance is limited by the gateway being false triggered by the strong blocker.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The foregoing description of the embodiments has been provided for the purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A wireless communication device for a sensor apparatus, comprising:
   an antenna;
   a driver circuit electrically coupled to the antenna and includes at least one pair of cross-coupled transistors; and
   a bias circuit electrically coupled to the driver circuit, wherein the bias circuit operates, in a transmit mode, to bias the driver circuit with a first bias current, and operates, in a receive mode, to bias the driver circuit with a second bias current, such that the first bias current differs from the second bias current,
   wherein the driver circuit, in response to the first bias current, oscillates the antenna and, in response to the second bias current, amplifies a signal received by the antenna.

2. The wireless communication device of claim 1 wherein the antenna is further defined as a loop antenna.

3. The wireless communication device of claim 1 wherein the driver circuit is further defined as a pair of NMOS field effect transistors cross-coupled to each other and coupled in parallel with the antenna.

4. The wireless communication device of claim 1 wherein the driver circuit is further defined as a Colpitts oscillator.

5. The wireless communication device of claim 1 wherein the driver circuit is further defined as a first pair of NMOS field effect transistors cross-coupled to each other and coupled in parallel with the antenna, and a second pair of PMOS field effect transistors cross-coupled to each other and coupled in parallel with the antenna, wherein the bias circuit biases the first pair of NMOS field effect transistors.

6. The wireless communication device of claim 1 wherein the second bias current has a magnitude set to substantially cancel resistive loss of the antenna and the first bias current has a magnitude larger than the second bias current.

7. The wireless communication device of claim 1 further comprises a frequency tuning circuit electrically coupled in parallel with the antenna and the tuning circuit includes at least one capacitor electrically coupled in parallel with the antenna.

8. The wireless communication device of claim 1 further comprises a controller interfaced with the bias circuit.

9. The wireless communication device of claim 1 is integrated into a sensor device, wherein the sensor device includes the antenna sandwiched between two circuit boards, the driver circuit mounted to one of the two circuit boards and the bias circuit mounted to one of the two circuit boards.

10. A wireless communication device for a sensor apparatus, comprising:
    an antenna having inductive impedance;
    a driver circuit electrically coupled to in parallel with the antenna and including a pair of cross-coupled transistors; and
    a bias circuit electrically coupled to the driver circuit, wherein the bias circuit operates, in a transmit mode, to bias the driver circuit with a first bias current, and operates, in a receive mode, to bias the driver circuit with a second bias current, such that the second bias current has a magnitude set to substantially cancel resistive loss of the antenna and thereby increase quality factor of the antenna during the receive mode,
    wherein the driver circuit, in response to the first bias current, oscillates the antenna and, in response to the second bias current, amplifies a signal received by the antenna.

11. The wireless communication device of claim 10 wherein the antenna is further defined as a loop antenna.

12. The wireless communication device of claim 11 further comprises a frequency tuning circuit electrically coupled in parallel with the antenna and the tuning circuit includes at least one capacitor electrically coupled in parallel with the antenna.

13. The wireless communication device of claim 12 wherein the driver circuit is further defined as a pair of NMOS field effect transistors cross-coupled to each other and coupled in parallel with the antenna, where gates of each transistor is coupled to drain of the other transistor, drains of each transistor are coupled to the antenna and sources of each transistor are coupled to the bias circuit.

14. The wireless communication device of claim 12 wherein the driver circuit is further defined as a Colpitts oscillator.

15. The wireless communication device of claim 12 wherein the driver circuit is further defined as a first pair of NMOS field effect transistors cross-coupled to each other and coupled in parallel with the antenna, and a second pair of PMOS field effect transistors cross-coupled to each other and coupled in parallel with the antenna, wherein the bias circuit biases the first pair of NMOS field effect transistors.

16. The wireless communication device of claim 12 is integrated into a sensor device, wherein the sensor device includes the antenna sandwiched between two circuit boards, the driver circuit mounted to one of the two circuit boards and the bias circuit mounted to one of the two circuit boards.

* * * * *